US008575660B2

(12) United States Patent
Nelson et al.

(10) Patent No.: US 8,575,660 B2
(45) Date of Patent: Nov. 5, 2013

(54) GROUP III-V SEMICONDUCTOR DEVICE WITH STRAIN-RELIEVING INTERLAYERS

(75) Inventors: Scott Nelson, River Falls, WI (US); Ronald Birkhahn, Minneapolis, MN (US); Brett Hughes, Hugo, MN (US)

(73) Assignee: International Rectifier Corporation, El Segundo, CA (US)

( * ) Notice: Subject to any disclaimer, the term of this patent is extended or adjusted under 35 U.S.C. 154(b) by 27 days.

(21) Appl. No.: 12/587,964

(22) Filed: Oct. 14, 2009

(65) Prior Publication Data

US 2011/0084311 A1    Apr. 14, 2011

(51) Int. Cl.
*H01L 31/06*    (2012.01)
(52) U.S. Cl.
USPC ....... 257/201; 257/E29.09; 438/172; 438/478
(58) Field of Classification Search
USPC .............................. 257/192–195, 201, E29.09
See application file for complete search history.

(56) References Cited

U.S. PATENT DOCUMENTS

| 6,447,604 | B1 | 9/2002 | Flynn |
| 6,617,060 | B2 | 9/2003 | Weeks |
| 6,775,314 | B1 | 8/2004 | Waldrip |
| 6,841,001 | B2 | 1/2005 | Saxler |
| 2002/0187356 | A1* | 12/2002 | Weeks et al. .................. 428/446 |
| 2007/0108456 | A1* | 5/2007 | Wong et al. ..................... 257/94 |
| 2007/0108466 | A1 | 5/2007 | Kryliouk |
| 2008/0220555 | A1 | 9/2008 | Saxler |
| 2009/0008647 | A1 | 1/2009 | Li |

FOREIGN PATENT DOCUMENTS

| JP | 2003/059948 | 2/2003 |
| JP | 2007-250721 | 9/2007 |
| JP | 2009/065025 | 3/2009 |
| WO | WO 2007/077666 | 7/2007 |

* cited by examiner

*Primary Examiner* — Tucker Wright
(74) *Attorney, Agent, or Firm* — Farjami & Farjami LLP

(57) ABSTRACT

According to one exemplary embodiment, a group III-V semiconductor device includes at least one transition layer situated over a substrate. The group III-V semiconductor device further includes a first strain-relieving interlayer situated over the at least one transition layer and a second strain-relieving interlayer situated over the first strain-relieving interlayer. The group III-V semiconductor device further includes a first group III-V semiconductor body situated over the second strain-relieving interlayer. The first and second strain-relieving interlayers comprise different semiconductor materials so as to reduce a strain in the first group III-V semiconductor body. The second strain-relieving interlayer can be substantially thinner than the first strain-relieving interlayer.

16 Claims, 3 Drawing Sheets

US 8,575,660 B2

GROUP III-V SEMICONDUCTOR DEVICE WITH STRAIN-RELIEVING INTERLAYERS

DEFINITION

In the present application, "group III-V semiconductor" refers to a compound semiconductor that includes at least one group III element and at least one group V element, such as, but not limited to, gallium nitride (GaN), gallium arsenide (GaAs), indium aluminum gallium nitride (InAlGaN), indium gallium nitride (InGaN) and the like. Analogously, "III-nitride semiconductor" refers to a compound semiconductor that includes nitrogen and at least one group III element, such as, but not limited to, GaN, AlGaN, InN, MN, InGaN, InAlGaN and the like.

BACKGROUND OF THE INVENTION

1. Field of the Invention

The present invention is generally in the field of semiconductors. More particularly, the invention is in the field of fabrication of compound semiconductor devices.

2. Background Art

A group III-V semiconductor device, such as a group III-V semiconductor heterojunction field effect transistor (HFET), can utilize a first semiconductor body comprising gallium nitride (GaN) and a second semiconductor body comprising aluminum gallium nitride (AlGaN) to achieve a high current conduction channel between the two semiconductor bodies. The group III-V semiconductor device can include a buffer layer between a silicon substrate and the first semiconductor body, where the buffer layer can comprise a group III-V semiconductor material such as aluminum nitride (AlN). However, forming the buffer layer on the silicon substrate can cause a strain in the first semiconductor body as a result of a difference in crystal lattice structure and thermal coefficient of expansion between the silicon substrate and the buffer layer.

If the first semiconductor body is too thick, the strain in the first semiconductor body can cause cracking in the epitaxial layers in the group III-V semiconductor device and/or cause an undesirable amount of wafer warping during device fabrication. However, for high voltage applications, the first semiconductor body requires a correspondingly high breakdown voltage, which is directly related to the thickness of the semiconductor body. For example, high voltage applications can require a breakdown voltage greater than approximately 300.0 volts. Thus, it is desirable to reduce the strain in the first semiconductor body so that its thickness can be sufficiently increased so as to provide a sufficiently high breakdown voltage for high voltage applications.

In a conventional approach for reducing the strain in the first semiconductor body of a conventional group III-V semiconductor device, a first transition layer comprising AlGaN can be formed over the buffer layer and a second transition layer comprising AlGaN with a lower aluminum composition can be formed over the first transition layer. In the conventional approach, the first and second transition layers can provide some strain reduction in the first semiconductor body. However, additional strain relief in the first semiconductor body may be necessary so as to allow its thickness to be sufficiently increased for high voltage applications without causing epitaxial layer cracking and/or an undesirable amount of wafer warping.

SUMMARY OF THE INVENTION

Group III-V semiconductor device with strain-relieving interlayers, substantially as shown in and/or described in connection with at least one of the figures, and as set forth more completely in the claims.

DETAILED DESCRIPTION OF THE INVENTION

The present invention is directed to a group III-V semiconductor device with strain-relieving interlayers. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
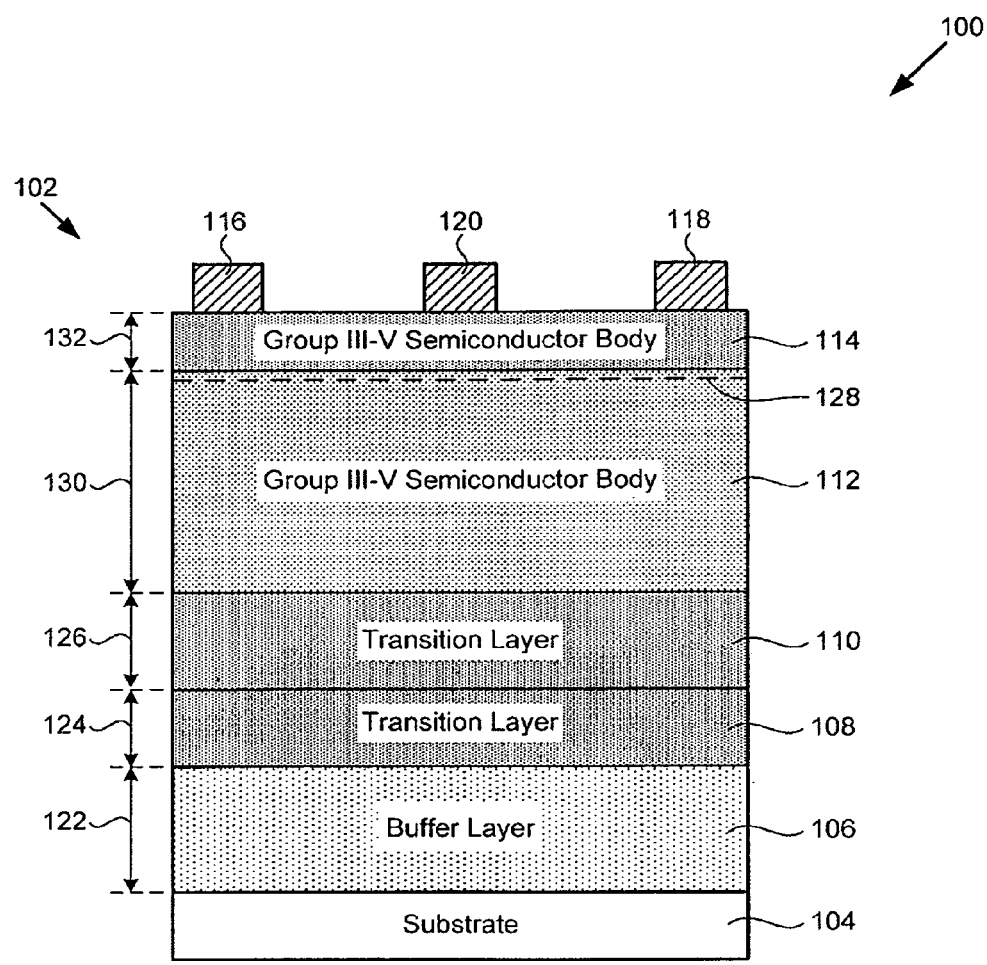
FIG. 1 illustrates a cross-sectional diagram of an exemplary conventional group III-V semiconductor device situated over a substrate.

FIG. 1 shows a cross-sectional diagram of an exemplary conventional group III-V semiconductor device situated on a substrate. Semiconductor structure 100 includes conventional group III-V semiconductor device 102 (also referred to simply as "conventional semiconductor device 102" in the patent application), which is situated on substrate 104. Conventional semiconductor device 102, which can be a group III-V semiconductor HFET, includes buffer layer 106, transition layers 108 and 110, group III-V semiconductor body 112 (also referred to simply as "semiconductor body 112" in the patent application), group III-V semiconductor body 114 (also referred to simply as "semiconductor body 114" in the patent application), source electrode 116, drain electrode 118, and gate electrode 120.

As shown in FIG. 1, buffer layer 106 is situated over substrate 104, which can be a silicon substrate. Buffer layer 106 can comprise aluminum nitride (AlN) and has thickness 122, which can be from approximately 0.2 microns to approximately 600.0 microns. Buffer layer 106 can be formed by utilizing a metal-organic chemical vapor deposition (MOCVD) process or a molecular beam epitaxy (MBE) deposition process. Also shown in FIG. 1, transition layer 108 is situated over buffer layer 106 and transition layer 110 is situated over transition layer 108. Transition layer 108 can comprise aluminum gallium nitride (AlGaN) with an aluminum composition of from approximately 40.0 percent to approximately 60.0 percent and transition layer 110 can comprise AlGaN with an aluminum composition of from approximately 15.0 percent to approximately 30.0 percent. Transition layers 108 and 110 can be formed, for example, by utilizing a MOCVD process or a MBE deposition process. Thickness 124 of transition layer 108 can be from approximately 0.10 microns to approximately 0.30 microns and thickness 126 of transition layer 110 can be from approximately 0.20 microns to approximately 0.50 microns.

Further shown in FIG. 1, semiconductor body 112 is situated over transition layer 110 and semiconductor body 114 is situated over semiconductor body 112. Semiconductor body 112 can comprise gallium nitride (GaN) and semiconductor body 114 can comprise AlGaN, which can have an aluminum composition from approximately 18.0 percent to approximately 28.0 percent. The thickness and composition of semiconductor bodies 112 and 114 can be selected so as to generate two-dimensional electron gas (2DEG) 128 at or in proximity to the heterojunction of the semiconductor bodies. Thickness 130 of semiconductor body 112 can be from approximately 0.6 microns to approximately 2.5 microns and thickness 132 of semiconductor body 114 can be from approximately 8.0 nanometers (nm) to approximately 27.0 nm. Further shown in FIG. 1, source electrode 116, drain electrode 118, and gate electrode 120 are situated over group III-V semiconductor body 114 (e.g. AlGaN). Source electrode 116, drain electrode 118, and gate electrode 120 can each comprise a metal or other conductive material and can be formed in a manner known in the art.

By utilizing high bandgap group III-V semiconductor materials such as GaN and AlGaN in respective semiconductor bodies 112 and 114, a thin conductive layer (i.e. 2DEG 128) capable of high current conduction can be provided at the heterojunction of the semiconductor bodies. For high voltage applications, semiconductor body 112 (e.g. a GaN layer) requires a correspondingly high breakdown voltage, which is directly related to its thickness (i.e. thickness 130 of semiconductor body 112). Thus, by increasing thickness 130, the breakdown voltage of semiconductor body 112 can be correspondingly increased. However, increasing thickness 130 can also increase the strain in semiconductor body 112, which can cause undesirable cracking in the epitaxial layers in semiconductor device 102, such as, for example, transition layers 108 and 110 and buffer layer 106. The increased strain in semiconductor body 112 can also undesirably increase wafer warping during fabrication of semiconductor device 102.

During fabrication of semiconductor device 102, buffer layer 106 (e.g. an AlN layer) can be strained as a result of a difference in crystal lattice structure and thermal coefficient of expansion between the silicon substrate (i.e. substrate 104) and the buffer layer. By reducing the aluminum composition in transition layer 108 and further reducing the aluminum composition in transition layer 110, transition layers 108 and 110 can reduce some of the strain introduced by buffer layer 106 and transmitter to semiconductor body 112. However, even with transition layers 108 and 110, enough strain can be transmitted to semiconductor body 112 to prevent its thickness from being increased sufficiently so as to provide the necessary high breakdown voltage required for high voltage operation without causing cracking in the epitaxial layers in semiconductor device 202 and/or causing an unacceptable amount of wafer warping.

Figure 2:
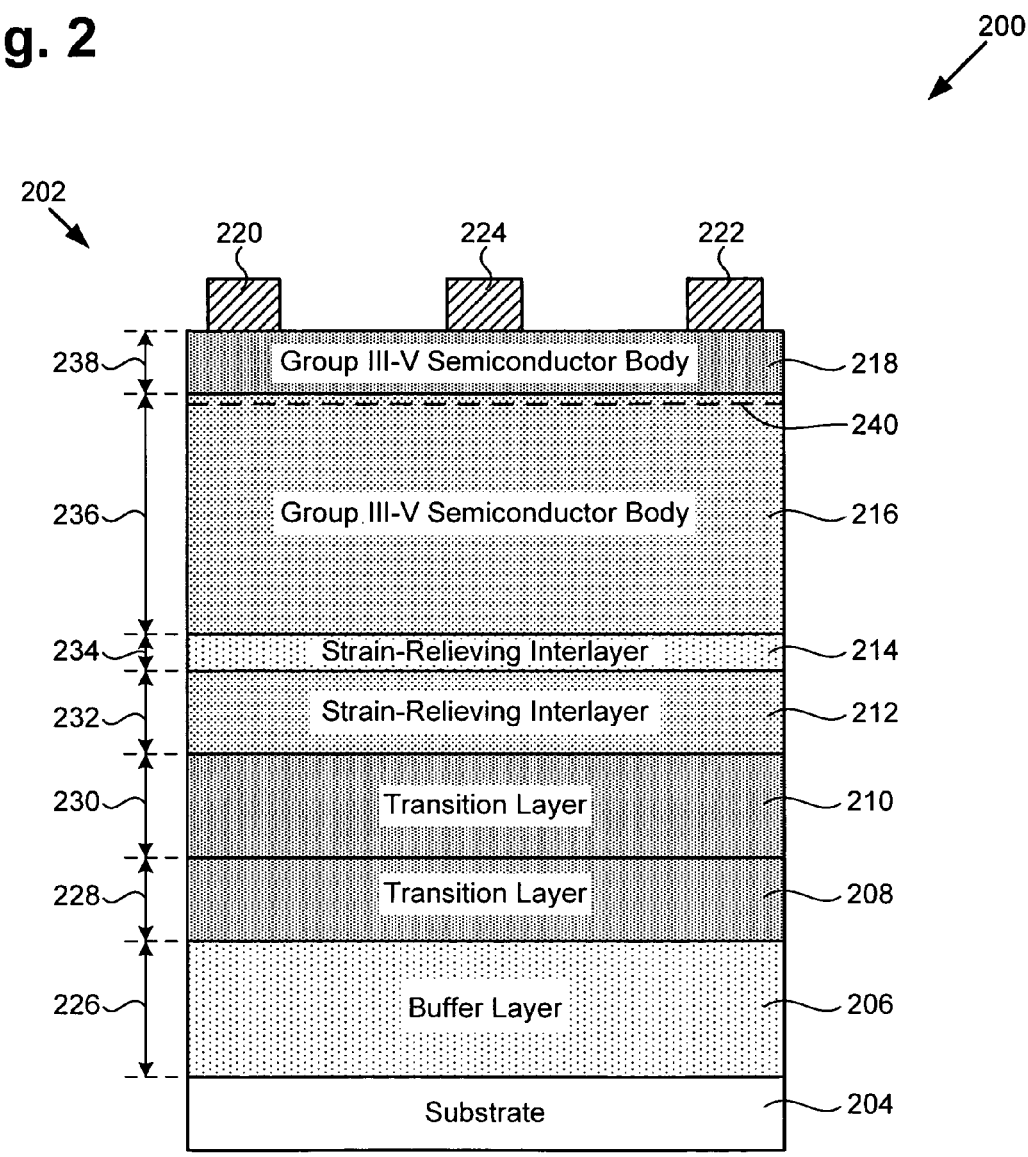
FIG. 2 illustrates a cross-sectional diagram of an exemplary group III-V semiconductor device with exemplary strain-relieving interlayers situated over a substrate in accordance with one embodiment of the present invention.

FIG. 2 shows a cross-sectional diagram of an exemplary group III-V semiconductor device with exemplary strain-relieving interlayers situated on a substrate in accordance with one embodiment of the present invention. Semiconductor structure 200 includes group III-V semiconductor device 202 (also referred to simply as "semiconductor device 202" in the patent application), which is situated on substrate 204. Semiconductor device 202 can be a group III-V semiconductor HFET, such as a group III-nitride HFET. Semiconductor device 202 includes buffer layer 206, transition layers 208 and 210, strain-relieving interlayers 212 and 214, group III-V semiconductor body 216 (also referred to simply as "semiconductor body 216" in the patent application), group III-V semiconductor body 218 (also referred to simply as "semiconductor body 218" in the patent application), source electrode 220, drain electrode 222, and gate electrode 224.

As shown in FIG. 2, buffer layer 206 is situated over substrate 204, which can be a semiconductor substrate, such as a silicon substrate. Buffer layer 206 can comprise, for example, AlN, and has thickness 226, which can be from approximately 0.2 microns to approximately 600.0 microns, for example. Buffer layer 206 can be formed, for example, by depositing a layer of AlN over substrate 204 by utilizing an MOCVD process, an MBE process, or other suitable deposition process. Also shown in FIG. 2, transition layer 208 is situated over buffer layer 206 and transition layer 210 is situated over transition layer 208. Transition layer 208 can comprise, for example, AlGaN with an aluminum composition of from approximately 40.0 percent to approximately 60.0 percent, and transition layer 210 can comprise, for example, AlGaN with an aluminum composition of from approximately 15.0 percent to approximately 30.0 percent.

Transition layer 208 has thickness 228, which can be, for example, from approximately 0.10 microns to approximately 0.30 microns. Transition layer 210 has thickness 230, which can be, for example, from approximately 0.20 microns to approximately 0.50 microns. Transition layer 208 can be formed, for example, by depositing a layer of AlGaN over buffer layer 204 by utilizing an MOCVD process, an MBE process, or other deposition process. Transition layer 210 can be formed, for example, by depositing a layer of AlGaN having a lower aluminum composition over transition layer 208 by utilizing an MOCVD process, an MBE process, or other suitable deposition process. In one embodiment of the invention, another transition layer comprising AlGaN with a lower aluminum composition than transition layer 210 can be formed over transition layer 210.

Further shown in FIG. 2, strain-relieving interlayer 212 is situated over transition layer 210 and strain-relieving interlayer 214 is situated over strain-relieving interlayer 212. Strain-relieving interlayer 212 can comprise, for example, GaN and has thickness 232. Thickness 232 can be, for example, from approximately 0.20 microns to approximately 0.5 microns in an embodiment of the invention. Strain-relieving interlayer 212 can be formed, for example, by depositing a layer of GaN over transition layer 212 by utilizing an MOCVD process, an MBE process, or other suitable deposition process. Strain-relieving interlayer 214 can comprise, for example, AlN and has thickness 234. In an embodiment of the invention, thickness 234 can be, for example, from approximately 0.01 microns to approximately 0.40 microns. Thus, strain-relieving interlayer 212 can be substantially thicker than strain-relieving interlayer 214 in an embodiment of the invention. In the present invention, strain-relieving interlayer 212 comprises a different semiconductor material than strain-relieving interlayer 214. In one embodiment, more than two strain-relieving interlayers can be disposed between transition layer 210 and semiconductor body 216.

Also shown in FIG. 2, semiconductor body 216 is situated over strain-relieving interlayer 214 and semiconductor body 218 is situated over semiconductor body 216. Semiconductor body 216 can comprise a III-V semiconductor material such as GaN and has thickness 236. In an embodiment of the invention, thickness 236 of semiconductor body 216 can be from approximately 0.6 microns to approximately 5.0 microns. Semiconductor body 218 can comprise a III-V semiconductor material, such as, for example, AlGaN, which can have an aluminum composition of from approximately 18.0 percent to approximately 28.0 percent. Semiconductor body 218 has thickness 238, which can be from approximately 8.0 nm to approximately 27.0 nm in an embodiment of the invention. Semiconductor body 218 can have a wider bandgap than semiconductor body 216 as a result of the difference in composition between semiconductor bodies 216 and 218. The thickness and composition of semiconductor bodies 216 and 218 can be selected to generate 2DEG (two-dimensional electron gas) 240 at or in proximity to the heterojunction of semiconductor bodies 216 and 218.

Further shown in FIG. 2, source electrode 220, drain electrode 222, and gate electrode 224 are situated over semiconductor body 218 (e.g. an AlGaN layer). Source electrode 220, drain electrode 222, and gate electrode 224 can each comprise a metal or other conductive material. Source electrode 220, drain electrode 222, and gate electrode 224 can be formed, for example, by depositing a layer of metal over semiconductor body 218 by utilizing an evaporation process or other suitable metal deposition process and appropriately patterning the layer of metal. In one embodiment of the invention, a dielectric layer can be formed between gate electrode 224 and semiconductor body 218.

By utilizing high bandgap group III-V semiconductor materials such as GaN and AlGaN in respective semiconductor bodies 216 and 218, a thin conductive layer (i.e. 2DEG 240) capable of high current conduction can be formed at the heterojunction (i.e. the interface) of semiconductor bodies 216 and 218.

During fabrication of semiconductor device 202, buffer layer 206 (e.g. an AlN layer) can be strained as a result of a difference in crystal lattice structure and thermal coefficient of expansion between substrate 204 (e.g. a silicon substrate) and buffer layer 206. Transition layers 208 and 210 can be utilized to reduce some of the strain in semiconductor body 216. For example, transition layers 208 and 210 can each comprise AlGaN, where transition layer 210 has a lower aluminum composition than transition layer 212. By reducing the aluminum composition of transition layer 210 compared to the aluminum composition of transistor layer 208, the difference in crystal lattice structure between transition layer 210 and semiconductor body 216 can be reduced so as to reduce some of the strain in the semiconductor body.

In an embodiment of the present invention, strain-relieving interlayers 212 and 214 are provided between transition layer 210 and semiconductor body 216 to cause a significant reduction of the strain in semiconductor body 216. To achieve the strain reduction in semiconductor body 216, strain-relieving interlayers 212 and 214 can comprise respective group III-V semiconductor materials that are selected to so as to provide a large difference in crystal lattice structure between the strain-relieving interlayers. Strain-relieving interlayers 212 and 214 can comprise, for example, GaN and AlN, respectively. In an embodiment of the invention, the strain-relieving interlayers (e.g. strain-relieving interlayers 212 and 214) comprise different group III-V semiconductor materials.

Also, strain-relieving interlayer 214 can be substantially thinner than strain-relieving interlayer 212. By forming strain-relieving interlayer 214 so as to be substantially thinner than strain-relieving interlayer 212, the strain in strain-relieving interlayer 214 can be significantly increased, thereby further increasing the difference in crystal lattice structure between the strain-relieving interlayers. Thus, by forming strain-relieving interlayers 212 and 214 from different group III-V semiconductor materials and forming strain-relieving interlayer 214 to be substantially thinner than strain-relieving interlayer 212, an embodiment of the invention can significantly reduce the strain in semiconductor body 216 (e.g. a GaN body).

For high voltage applications, semiconductor body 216 requires a correspondingly high breakdown voltage, which is directly related to the thickness of the semiconductor body. In an embodiment of the invention, by utilizing strain-relieving interlayers 212 and 214 to significantly reduce the strain in semiconductor body 216, semiconductor body 216 can have a sufficient thickness so as to provide a sufficiently high breakdown voltage as required for high voltage applications. In an embodiment of the invention's semiconductor device, semiconductor body 216, which can comprise GaN, can have a sufficient thickness so as to advantageously provide a breakdown voltage greater than approximately 500.0 volts, for example. Thus, an embodiment of the invention can provide a group III-V semiconductor device that can operate at high voltage by utilizing strain-relieving interlayers to sufficiently reduce the strain in a group III-V semiconductor body overlying the strain-relieving interlayers.

Figure 3:
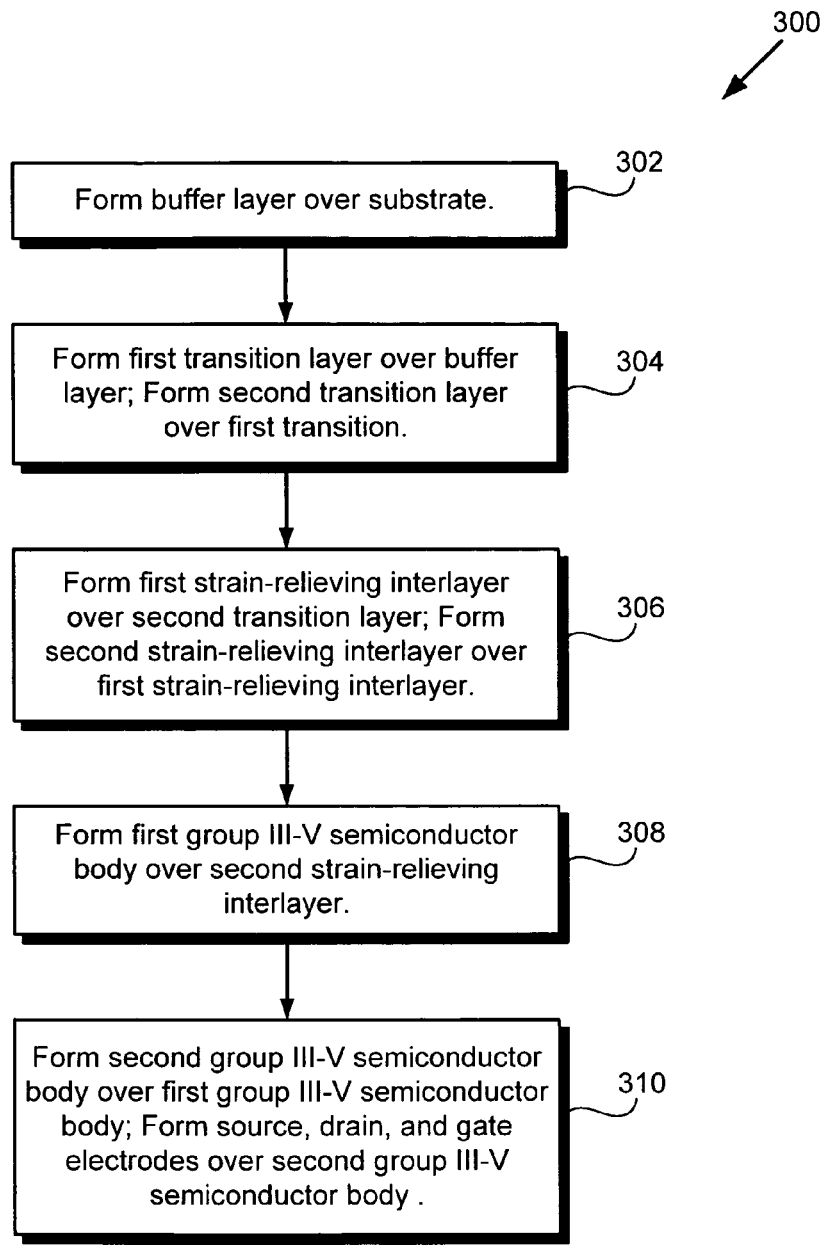
FIG. 3 shows a flowchart illustrating an exemplary method for forming a group III-V semiconductor device with strain-relieving interlayers in accordance with one embodiment of the present invention.

FIG. 3 shows a flowchart illustrating an exemplary method for fabricating a III-V semiconductor device with strain-relieving interlayers according to one embodiment of the present invention. Certain details and features have been left out of flowchart 300 that are apparent to a person of ordinary skill in the art. For example, a step may consist of one or more substeps or may involve specialized equipment or materials, as known in the art. It is noted that the processing steps shown in flowchart 300 are performed on a portion of a wafer, which, prior to step 302 of flowchart 300, includes a semiconductor substrate, such as a silicon substrate. The wafer is also referred to as a semiconductor die or simply a die in the present application.

At step 302 of flowchart 300, buffer layer 206 is formed over substrate 204, which can be a silicon substrate. Buffer layer 206 can comprise, for example, AlN and can be formed by utilizing an MOCVD process, an MBE process, or other suitable deposition process. At step 304 of flowchart 300, transition layer 208 is formed over buffer layer 206 and transition layer 210 is formed over transition layer 208. For example, transition layer 208 can comprise AlGaN with a 40.0 percent to 60.0 percent aluminum composition and transistor layer 210 can comprise AlGaN with a 15.0 percent to 30.0 percent aluminum composition. For example, transition layer 210 can have a greater thickness than transition layer 208. Transition layers 208 and 210 can be formed, for example, by utilizing an MOCVD process or an MBE process.

At step 306 of flowchart 300, strain-relieving interlayer 212 is formed over transition layer 210 and strain-relieving interlayer 214 is formed over strain-relieving interlayer 212. Strain-relieving interlayers 212 and 214 can comprise, for example, GaN and AlN, respectively. For example, strain-relieving interlayer 214 can be substantially thinner than strain-relieving interlayer 212. For example, strain-relieving interlayer 214 can have a thickness of from approximately 0.01 microns to approximately 0.04 microns and strain-relieving interlayer 212 can have a thickness of from approximately 0.2 microns to approximately 0.5 microns. Strain-relieving interlayers 212 and 214 can each be formed, for example, by utilizing an MOCVD process, an MBE process, or other suitable deposition process.

At step 308 of flowchart 300, semiconductor body 216 is formed over strain-relieving interlayer 214. Semiconductor body 216 can comprise, for example, GaN and can have a thickness of from approximately 0.6 microns to approximately 5.0 microns in an embodiment of the invention. Semiconductor body 216 can be formed, for example, by utilizing an MOCVD process, an MBE process, or other suitable deposition process. At step 310 of flowchart 300, semiconductor body 218 is formed over semiconductor body 216 and source electrode 220, drain electrode 222, and gate electrode 224 are formed over semiconductor body 218. Semiconductor body 218 can comprise, for example, AlGaN. The thickness and composition of semiconductor bodies 216 and 218 can be selected to generate 2DEG 240 at or in proximity to the heterojunction of semiconductor bodies 216 and 218. Semiconductor body 218 can be formed, for example, by utilizing an MOCVD process, an MBE process, or other suitable deposition process. Source electrode 220, drain electrode 222, and gate electrode 224 can comprise a metal or other conductive material and can be formed, for example, by depositing a layer of metal over semiconductor body 218 by utilizing an evaporation process or other suitable metal deposition process and appropriately patterning the layer of metal.

Thus, as discussed above, an embodiment of the invention provides a group III-V semiconductor device, such as a group III-V semiconductor HFET, that includes strain-relieving interlayers disposed between a transition layer and a semiconductor body, such as a GaN body, where the strain-relieving interlayers significantly reduce strain in the semiconductor body. As a result of the reduced strain in the semiconductor body, its thickness can be advantageously increased so as to provide a sufficiently high breakdown voltage as required for high voltage applications without causing epitaxial layer cracking and/or unacceptable wafer warping during device fabrication. Thus, by utilizing strain-relieving interlayers, an embodiment of the invention can provide a semiconductor body, such as GaN body, having a significantly higher breakdown voltage compared to a semiconductor body, such as a GaN body, in conventional III-V semiconductor device, such as conventional III-V semiconductor device 102 in FIG. 1.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A group III-V semiconductor device comprising:
at least one transition layer situated over a substrate;
a first strain-relieving interlayer situated over said at least one transition layer and a second strain-relieving interlayer situated over said first strain-relieving interlayer;
a first group III-V semiconductor body situated over said second strain-relieving interlayer, said first group III-V semiconductor body substantially thicker than said first and second strain-relieving interlayers;
said first and second strain-relieving interlayers comprising different semiconductor materials so as to reduce a strain in said first group III-V semiconductor body;
said first strain-relieving interlayer at least five times thicker than said second strain-relieving interlayer;
said second strain-relieving interlayer being an aluminum nitride (AlN) layer.

2. The group III-V semiconductor device of claim 1 further comprising a buffer layer disposed between said substrate and said at least one transition layer.

3. The group III-V semiconductor device of claim 1, wherein said first strain-relieving interlayer comprises gallium nitride (GaN).

4. The group III-V semiconductor device of claim 1, wherein said first strain-relieving interlayer has a thickness of from approximately 0.2 microns to approximately 0.5 microns.

5. The group III-V semiconductor device of claim 1, wherein said second strain-relieving interlayer has a thickness of from approximately 0.01 microns to approximately 0.04 microns.

6. The group III-V semiconductor device of claim 1, wherein said at least one transition layer comprises a first transition layer of aluminum gallium nitride (AlGaN) and a second transition layer of aluminum gallium nitride (AlGaN), wherein said second transition layer has a lower aluminum composition than said first transition layer.

7. The group III-V semiconductor device of claim 1, wherein said first group III-V semiconductor body has a thickness of from approximately 0.6 microns to approximately 5.0 microns.

8. The group III-V semiconductor device of claim 1 further comprising a second group III-V semiconductor body situated over said first group III-V semiconductor body, wherein a two-dimensional electron gas (2DEG) forms at a heterojunction of said first and second group III-V semiconductor bodies.

9. A method for forming a group III-V semiconductor device over a substrate, said method comprising:
forming at least one transition layer situated over said substrate;
forming a first strain-relieving interlayer over said at least one transition layer and a second strain-relieving interlayer over said first strain-relieving interlayer;
forming a first group III-V semiconductor body over said second strain-relieving interlayer, said first group III-V semiconductor body substantially thicker than said first and second strain-relieving interlayers;
said first and second strain-relieving interlayers comprising different semiconductor materials so as to reduce a strain in said first group III-V semiconductor body;
said first strain-relieving interlayer at least five times thicker than said second strain-relieving interlayer;
said second strain-relieving interlayer being an aluminum nitride (AlN) layer.

10. The method of claim 9 further comprising forming a buffer layer over said substrate prior to forming said at least one transition layer.

11. The method of claim 9, wherein said first strain-relieving interlayer comprises gallium nitride (GaN).

12. The method of claim 9, wherein said first strain-relieving interlayer has a thickness of from approximately 0.2 microns to approximately 0.5 microns.

13. The method of claim 9, wherein said second strain-relieving interlayer has a thickness of from approximately 0.01 microns to approximately 0.04 microns.

14. The method of claim 9, wherein said at least one transition layer comprises a first transition layer of aluminum gallium nitride (AlGaN) and a second transition layer of aluminum gallium nitride (AlGaN), wherein said second transition layer has a lower aluminum composition than said first transition layer.

15. The method of claim 9, wherein said first group III-V semiconductor body has a thickness of from approximately 0.6 microns to approximately 5.0 microns.

16. The method of claim 9 further comprising forming a second group III-V semiconductor body over said first group III-V semiconductor body, wherein a two-dimensional electron gas (2DEG) is formed at a heterojunction of said first and second group III-V semiconductor bodies.

* * * * *